(12) United States Patent
Liu

(10) Patent No.: US 12,439,547 B2
(45) Date of Patent: Oct. 7, 2025

(54) HEAT DISSIPATION ASSEMBLY AND DISPLAY APPARATUS

(71) Applicant: Tianma Advanced Display Technology Institute (Xiamen) Co., Ltd., Xiamen (CN)

(72) Inventor: Jingjing Liu, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 217 days.

(21) Appl. No.: 18/468,856

(22) Filed: Sep. 18, 2023

(65) Prior Publication Data

US 2024/0064928 A1 Feb. 22, 2024

(30) Foreign Application Priority Data

Jun. 29, 2023 (CN) .................. CN202310783870.X

(51) Int. Cl.
*H05K 7/20* (2006.01)
(52) U.S. Cl.
CPC ..... *H05K 7/20145* (2013.01); *H05K 7/20972* (2013.01)
(58) Field of Classification Search
CPC ........... H05K 7/20145; H05K 7/20972; H05K 7/20127; H05K 5/0217; G06F 1/1652; G06F 1/1656; G06F 1/203; G09F 9/301
See application file for complete search history.

(56) References Cited

U.S. PATENT DOCUMENTS

| 2013/0016497 A1* | 1/2013 | Anderson | G09F 13/22 362/97.1 |
| 2018/0027672 A1* | 1/2018 | Cho | H04R 1/028 361/697 |
| 2019/0297175 A1* | 9/2019 | Lin | G08B 3/10 |
| 2021/0165471 A1* | 6/2021 | Chen | G06F 1/206 |
| 2021/0208552 A1* | 7/2021 | Choi | G06F 1/1656 |
| 2022/0019260 A1* | 1/2022 | Kang | G06F 1/1698 |
| 2022/0187873 A1* | 6/2022 | Zhang | G06F 1/1601 |
| 2024/0081018 A1* | 3/2024 | Yosho | H05K 7/20154 |
| 2024/0393846 A1* | 11/2024 | Kim | G06F 1/1677 |

FOREIGN PATENT DOCUMENTS

CN 112165833 A * 1/2021 .............. G09F 9/33

OTHER PUBLICATIONS

Zhang Xiaoyin, "Heat dissipation system and display device", Jan. 1, 2021, Xiamen Tianma Micro Electronics Co Ltd, Entire Document (Translation of CN 112165833). (Year: 2021).*

* cited by examiner

*Primary Examiner* — Stephen S Sul
(74) *Attorney, Agent, or Firm* — CHRISTENSEN O'CONNOR JOHNSON KINDNESS PLLC

(57) ABSTRACT

A heat dissipation assembly and a display apparatus are described. The heat dissipation assembly includes an outer housing and an inner housing. One end of the outer housing is provided with a first air inlet, and a housing wall of the outer housing is provided with a first air outlet extending along a first direction. One end of the inner housing is provided with a second air inlet, and a housing wall of the inner housing is provided with a second air outlet extending along the first direction. The first air outlet and the second air outlet at least partially overlap to form an air outlet overlapping part. A width of the air outlet overlapping part is adjustable. Therefore, a width of an air outlet of the heat dissipation assembly is adjustable according to the heat dissipation demand.

19 Claims, 10 Drawing Sheets

HEAT DISSIPATION ASSEMBLY AND DISPLAY APPARATUS

CROSS-REFERENCE TO RELATED APPLICATION

The present application claims priority to Chinese Patent Application No. 202310783870.X, filed on Jun. 29, 2023, the content of which is incorporated herein by reference in its entirety.

TECHNICAL FIELD

The present disclosure relates to the technical field of display, and more specifically, to a heat dissipation assembly and a display apparatus.

BACKGROUND

With the continuous development of electronic display technologies, people have an increasingly higher requirement for a display apparatus. In recent years, a flexible display apparatus has been developed. Usually, the flexible display apparatus can be reduced in size by folding or rolling up a flexible display panel, such that the flexible display apparatus is more portable. When the flexible display apparatus performs displaying, the flexible display panel is unfolded to perform a display function.

The display panel generates heat during use, and overheating may occur due to excessive heat accumulation. Overheating negatively affects performance of the display panel and may even cause shutdown.

SUMMARY

The present disclosure provides a heat dissipation assembly and a display apparatus.

According to an aspect of the present disclosure, a heat dissipation assembly is provided. The heat dissipation assembly includes a housing. The housing includes an outer housing and an inner housing. In an embodiment, along a first direction, the outer housing is provided with a first air inlet at a first end of the outer housing and an installation port at a second end of the outer housing and used for installing the inner housing. In an embodiment, a housing wall of the outer housing is further provided with a first air outlet extending along the first direction. In an embodiment, along the first direction, a second air inlet is formed at one end of the inner housing and is disposed opposite to the first air inlet. In an embodiment, a housing wall of the inner housing is provided with a second air outlet extending along the first direction. In an embodiment, the inner housing is sleeved in the outer housing. In an embodiment, the first air outlet and the second air outlet at least partially overlap along a second direction to form an air outlet overlapping part. In an embodiment, the first air outlet exposes at least a portion of the second air outlet. In an embodiment, the first direction crosses the second direction. In an embodiment, the heat dissipation assembly includes a first working state and a second working state, and a width of the air outlet overlapping part along the first direction is L1 in the first working state and L2 in the second working state, where L1>L2.

According to another aspect of the present disclosure, a display apparatus is provided. In an embodiment, the display apparatus includes a display panel and a heat dissipation assembly. The heat dissipation assembly includes a housing. The housing includes an outer housing and an inner housing. In an embodiment, along a first direction, the outer housing is provided with a first air inlet at a first end of the outer housing and an installation port at a second end of the outer housing and used for installing the inner housing. In an embodiment, a housing wall of the outer housing is further provided with a first air outlet extending along the first direction. In an embodiment, along the first direction, a second air inlet is formed at one end of the inner housing and is disposed opposite to the first air inlet. In an embodiment, a housing wall of the inner housing is provided with a second air outlet extending along the first direction. In an embodiment, the inner housing is sleeved in the outer housing. In an embodiment, the first air outlet and the second air outlet at least partially overlap along a second direction to form an air outlet overlapping part. In an embodiment, the first air outlet exposes at least a portion of the second air outlet. In an embodiment, the first direction crosses the second direction. In an embodiment, the heat dissipation assembly includes a first working state and a second working state, and a width of the air outlet overlapping part along the first direction is L1 in the first working state and L2 in the second working state, where L1>L2. In an embodiment, along the second direction, the display panel is located at one side of the first air outlet, and the heat dissipation assembly is configured to dissipate heat for the display panel.

BRIEF DESCRIPTION OF DRAWINGS

The accompanying drawings, which are incorporated in and constitute a part of the specification, illustrate embodiments of the present disclosure and together with the description, serve to explain the principles of the present disclosure.

DESCRIPTION OF EMBODIMENTS

Figure 1:
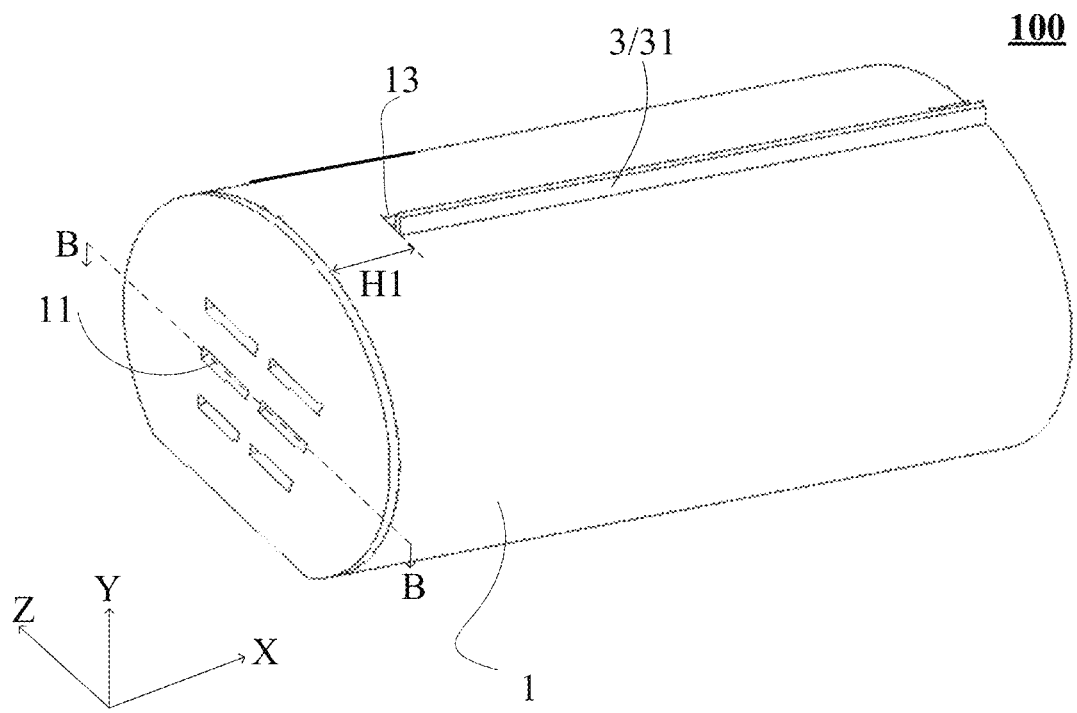
FIG. 1 is a structural diagram of a heat dissipation assembly in a first working state according to an embodiment of the present disclosure.

The exemplary embodiments of the present disclosure are described below with reference to the drawings. It should be noted that unless otherwise specified, the relative arrangement, numerical expressions, and numerical values of components and steps set forth in these embodiments do not limit the scope of the present disclosure.

The following description of at least one exemplary example is merely illustrative, and not intended to limit the present disclosure and application or use thereof in any way.

The technologies, methods, and devices known to those of ordinary skill in the art may not be discussed in detail, but where appropriate, the technologies, methods, and devices should be regarded as part of the specification.

In all examples shown and discussed herein, any specific value should be interpreted as merely exemplary, rather than restrictive. Therefore, other examples of the exemplary embodiments may have different values.

It is obvious for those skilled in the art that various modifications and changes may be made to the present disclosure without departing from the spirit or scope of the present disclosure. Therefore, the present disclosure is intended to cover the modifications and changes on the present disclosure that fall within the range of the corresponding claims (technical solutions claimed) and equivalents thereof. It should be noted that the implementations provided in the embodiments of the present disclosure can be combined with each other if no conflict occurs.

It should be noted that similar reference numerals and letters represent similar items in the drawings below. Therefore, once an item is defined in one drawing, it does not need to be further discussed in subsequent drawings.

The present disclosure provides a heat dissipation assembly, including a housing. The housing includes an outer housing and an inner housing. Along a first direction, the outer housing is provided with a first air inlet at one end of the outer housing and an installation port at the other end of the outer housing. The installation port is used for installing the inner housing. A housing wall of the outer housing is further provided with a first air outlet extending along the first direction. A second air inlet is formed at one end of the inner housing and is disposed opposite to the first air inlet along the first direction. A housing wall of the inner housing is provided with a second air outlet extending along the first direction. The inner housing is sleeved in the outer housing. The first air outlet and the second air outlet at least partially overlap along a second direction to form an air outlet overlapping part, the first air outlet exposes at least a portion of the second air outlet, and the first direction crosses the second direction. The heat dissipation assembly has a first working state and a second working state. A width of the air outlet overlapping part along the first direction is L1 in the first working state and L2 in the second working state, where L1>L2. The first air outlet and the second air outlet of the heat dissipation assembly provided in the present disclosure at least partially overlap to form the air outlet overlapping part. The width of the air outlet overlapping part is changeable, such that a width of an air outlet of the heat dissipation assembly can be changed by changing the width of the air outlet overlapping part. Further, the width of the air outlet of the heat dissipation assembly may be adjusted based on a width of a display screen or an unrolled width of a rolled screen, such that the heat dissipation assembly can meet heat dissipation requirements of display panels with different widths or unrolled widths.

Embodiments of the present disclosure will be clearly and completely described below in combination with the accompanying drawings in the embodiments of the present disclosure. All other embodiments obtained by persons of ordinary skill in the art based on the embodiments of the present disclosure without creative efforts shall fall within the protection scope of the embodiments of the present disclosure.

Figure 2:
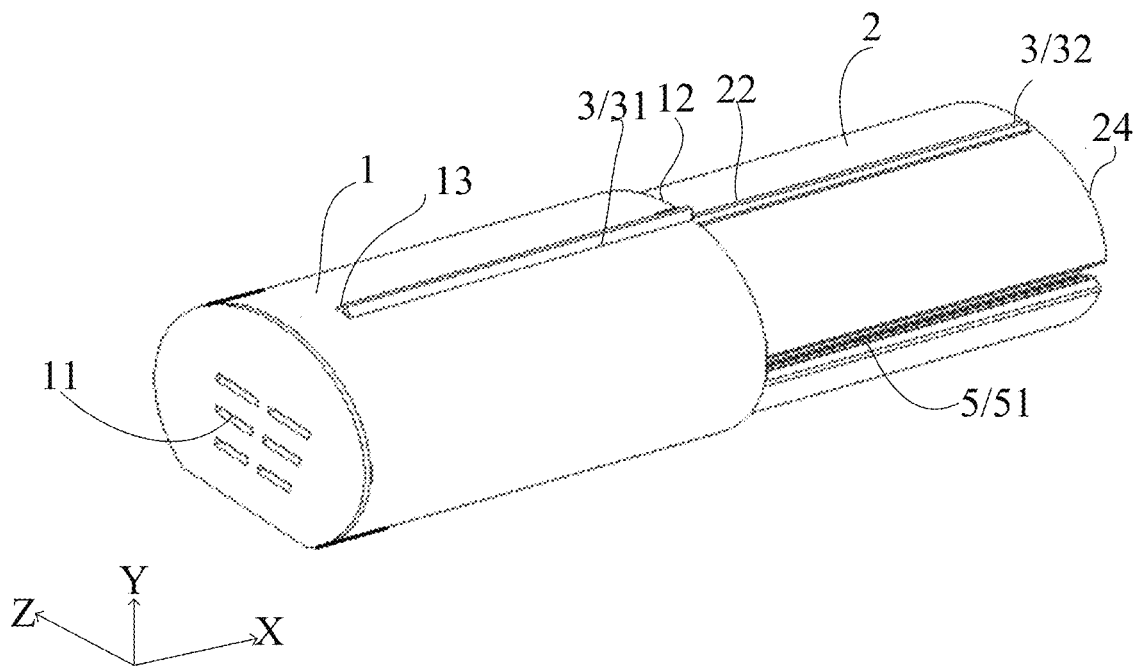
FIG. 2 is a structural diagram of a heat dissipation assembly in a second working state according to an embodiment of the present disclosure.
Figure 3:
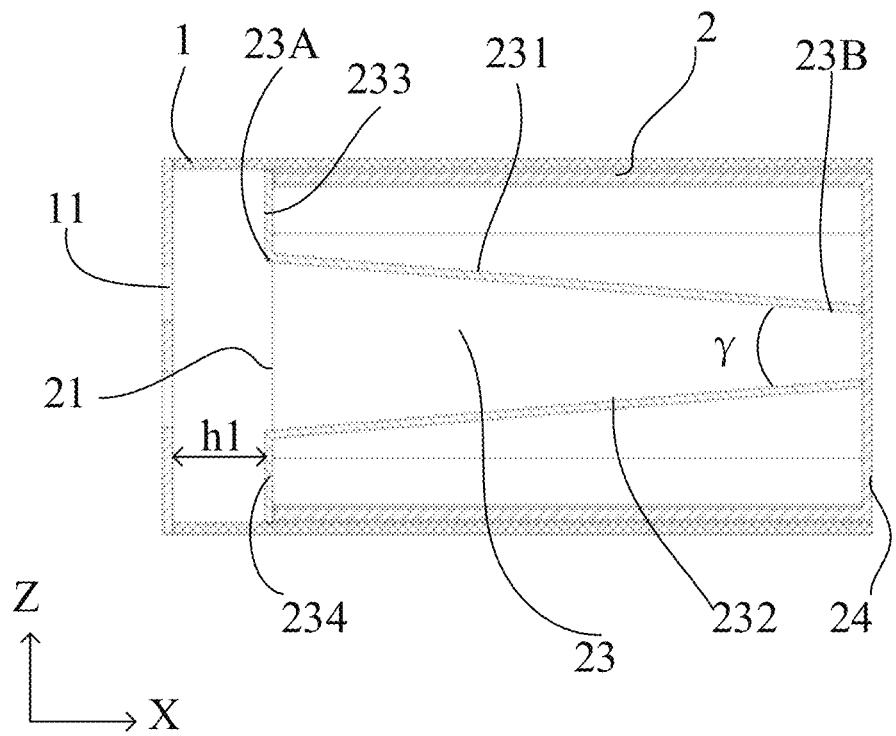
FIG. 3 is a sectional view of the heat dissipation assembly taken along line B-B shown in FIG. 1 according to an embodiment of the present disclosure.

FIG. 1 is a structural diagram of a heat dissipation assembly in a first working state according to an embodiment of the present disclosure. FIG. 2 is a structural diagram of the heat dissipation assembly in a second working state according to an embodiment of the present disclosure. FIG. 3 is a sectional view of the heat dissipation assembly taken along line B-B shown in FIG. 1.

Referring to FIG. 1 to FIG. 3, the heat dissipation assembly 100 includes a housing. The housing includes an outer housing 1 and an inner housing 2. Along a first direction X, one end of the outer housing 1 is provided with a first air inlet 11, and the other end of the outer housing 1 is provided with an installation port 12 for installing the inner housing. A housing wall of the outer housing 1 is further provided with a first air outlet 13 extending along the first direction X. Along the first direction X, one end of the inner housing 2 is provided with a second air inlet 21, and the second air inlet 21 is disposed opposite to the first air inlet 11. A housing wall of the inner housing 2 is provided with a second air outlet 22 extending along the first direction X. The inner housing 2 is sleeved in the outer housing 1. The first air outlet 13 and the second air outlet 22 at least partially overlap along a second direction Y to form an air outlet overlapping part, the first air outlet 13 exposes at least a portion of the second air outlet 22, and the first direction X crosses the second direction Y. The heat dissipation assembly 100 has a first working state and a second working state, and a width of the air outlet overlapping part along the first direction is L1 in the first working state and L2 in the second working state, where L1>L2.

Still referring to FIG. 1 to FIG. 3, as shown in FIG. 1, when the heat dissipation assembly 100 is in the first working state, the inner housing 2 is located in the outer housing 1. In this case, along the first direction X, the first air outlet 13 and the second air outlet 22 have a maximum overlapping width. In some embodiments of the present disclosure, if a width of the first air outlet 13 along the first direction X is a1, a width of the second air outlet 22 along the first direction X is a2, and a1 is less than a2, a width of an air outlet of the heat dissipation assembly 100 along the first direction X is a1. If a1 is greater than a2, the width of the air outlet of the heat dissipation assembly 100 along the first direction X is a2.

As shown in FIG. 2, when the heat dissipation assembly 100 is in the second working state, the inner housing 2 is at least partially located outside the outer housing 1 along the first direction X. In this case, along the first direction X, the first air outlet 13 and the second air outlet 22 have a smaller overlapping width compared with that in the first working state shown in FIG. 1. In some embodiments of the present disclosure, if the first air outlet 13 and the second air outlet 22 have a very small overlapping width, the width of the air outlet of the heat dissipation assembly 100 along the first direction X is a sum of the width of the first air outlet 13 and the width of the second air outlet 22 along the first direction X.

Therefore, along the first direction X, when a small heat dissipation width is required, the inner housing 1 is located in the outer housing 2, and the first air outlet 13 and the second air outlet 22 have the maximum overlapping width. When a large heat dissipation width is required, the inner housing 1 may is moved relative to the outer housing 2, and the first air outlet 13 and the second air outlet 22 have a minimum overlapping width, which can increase the overall width of the air outlet of the heat dissipation assembly 100.

It should be noted that FIG. 1 and FIG. 2 are only schematic illustration of the two different working states of the heat dissipation assembly 100 in the present disclosure, and the heat dissipation assembly 100 is not limited to the two working states. FIG. 1 may be taken as a schematic diagram of the heat dissipation assembly 100 in the first working state, and FIG. 2 may be taken as a schematic diagram of the heat dissipation assembly 100 in the second working state. As the width of the air outlet overlapping part along the first direction changes, the heat dissipation assembly 100 in the present disclosure has a plurality of intermediate working states between the working states shown in FIG. 1 and FIG. 2, which is not limited in the present disclosure.

In conclusion, the heat dissipation assembly 100 in the present disclosure can adjust the overlapping width of the first air outlet 13 and the second air outlet 22 along the first direction X based on a required heat dissipation width of a to-be-cooled object, such that the width of the air outlet of the heat dissipation assembly 100 is suitable for the required heat dissipation width of the to-be-cooled object. This can make an air volume blown out from the air outlet of the heat dissipation assembly 100 be more effectively utilized, to prevent cold air from being wasted because the width of the air outlet of the heat dissipation assembly 100 is greater than the required heat dissipation width of the to-be-cooled object, thereby improving a cold air utilization rate of the heat dissipation apparatus. In addition, the heat dissipation assembly 100 in the present disclosure includes the inner housing 1 and the outer housing 2, and the inner housing 1 may be sleeved in the outer housing 2. In this way, when the heat dissipation assembly 100 does not work or when the required heat dissipation width of the to-be-cooled object is small, the heat dissipation assembly 100 occupies small space and can be easily carried or placed. The heat dissipation assembly 100 in the present disclosure has an independent structure and can be independent of the to-be-cooled object. Therefore, the heat dissipation assembly 100 is a relatively independent component, and can be easily assembled or maintained.

It should be noted that along the first direction X, the inner housing 2 is provided with the second air inlet 21 at one end close to the first air inlet 11. The other end of the inner housing 2 opposite to the second air inlet 21 may be provided with a sealing structure 24 for end portion sealing. In this way, the cold air can only be blown out of the second air outlet 22 of the inner housing 2, avoiding air loss.

It should also be noted that FIG. 1, FIG. 2, and FIG. 3 provide a merely specific example of the heat dissipation assembly 100 in the present disclosure, aiming to illustrate a matching relationship between the air outlets of the outer housing 1 and the inner housing 2 of the heat dissipation assembly 100, and are not intended to limit a shape of the outer housing 1 or the inner housing 2.

Figure 4:
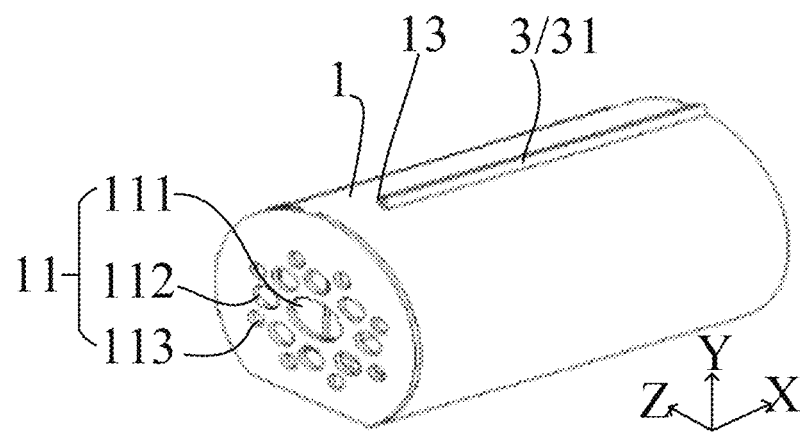
FIG. 4 is a structural diagram of a heat dissipation assembly in a first working state according to an embodiment of the present disclosure.

FIG. 4 is a structural diagram of the heat dissipation assembly in the first working state according to an embodiment of the present disclosure. Referring to FIG. 4, the first air inlet 11 of the outer housing 1 includes a plate including a central region and an edge region surrounding the central region. The central region is provided with a central hole 111. The edge region is provided with a plurality of edge holes at least partially surrounding the central hole. A width of the central hole 111 along a direction perpendicular to the first direction X is greater than a width of the edge hole along the direction perpendicular to the first direction X. In some embodiments, the edge holes include a first edge hole 112 and a second edge hole 113. The first edge hole 112 is closer to the central hole 111 than the second edge hole 113. A width of the first edge hole 112 along the direction perpendicular to the first direction X is greater than a width of the second edge hole 113 along the direction perpendicular to the first direction X. In some embodiments, an aperture of the first edge hole 112 is greater than that of the second edge hole 113.

Still referring to FIG. 4, in the structure shown in FIG. 4, the width of the central hole 111 along the direction perpendicular to the first direction X is greater than the width of the edge hole along the direction perpendicular to the first direction X. The outer housing 1 is provided with the plate at one end along the first direction X. Along the direction perpendicular to the first direction X, the plate includes the central region and the edge region surrounding the central region. The central region is provided with the central hole 111, and the edge region is provided with first edge holes 112 arranged in a circle and second edge holes 113 arranged in a circle surrounding the central hole 111. The first edge hole 112 is closer to the central hole 111 than the second edge hole 113. The central hole 111 has a largest cross-sectional area, while the second edge hole 113 has a smallest cross-sectional area. In this embodiment, the central hole 111, the first edge holes 112 surrounding the central hole 111, and the second edge holes 113 surrounding the central hole 111 jointly form the first air inlet 11 of the heat dissipation assembly 100. The cold air is fed into the outer housing 1 from an outer side of the outer housing 1 through the first air inlet 11. Due to the maximum cross-sectional area of the central hole 111, a largest volume of air passes through the central hole 111. Additionally, due to the minimum cross-sectional area of the second edge hole 113 farther from the central hole 111 than the first edge hole 112, a smallest volume of air enters the outer housing from the second edge hole 113. Therefore, a larger volume of air enters the central region of the plate, and a smaller volume of air enters the edge region of the plate. Therefore, along the direction perpendicular to the first direction X, inlet air is concentrated in the central region of the outer housing 1. Therefore, the air entering the outer housing 1 from the first air inlet 11 is of a larger air amount and a strong air flow in the central region of the outer housing 1, and can be transmitted farther.

In some embodiments of the present disclosure, as shown in FIG. 2, along the first direction X, when the inner housing 2 slides out of the outer housing 1 for a long distance, the overlapping width of the first air outlet 13 and the second air outlet 22 is very small. Therefore, the width of the air outlet of the heat dissipation assembly 100 is approximately the sum of the width of the first air outlet 13 and the width of the second air outlet 22. In other words, in this state, the air outlet of the heat dissipation assembly 100 is relatively large. Because air entering the outer housing 1 from the first air inlet 11 continuously flows during transmission and exits through the air outlet of heat dissipation assembly 100, the air volume at a position farther from the first air inlet 11 is smaller. The air volume at the second air outlet 22 of the heat dissipation assembly 100 far away from the first air inlet 11 may be insufficient. In the present disclosure, a plate with holes is provided at the first air inlet 11 in the heat dissipation assembly 100. The plate with holes is used to increase an air volume in the central region of the outer housing 1. This can increase the strength of the air flow in the central region of the outer housing 1 to a certain extent to ensure the air volume of the second air outlet 22 far away from the first air inlet 11. In this way, the second air outlet 22 can outputs the cold air throughout the entire width, to better meet a heat dissipation requirement.

It should be noted that the plate shown in FIG. 4 is only an example of the present disclosure and does not limit a structure of the plate in the present disclosure. For example, the hole may be a round hole or a hole in another shape. The edge holes may be arranged in one or more rings each surrounding the central hole 111.

Figure 5:
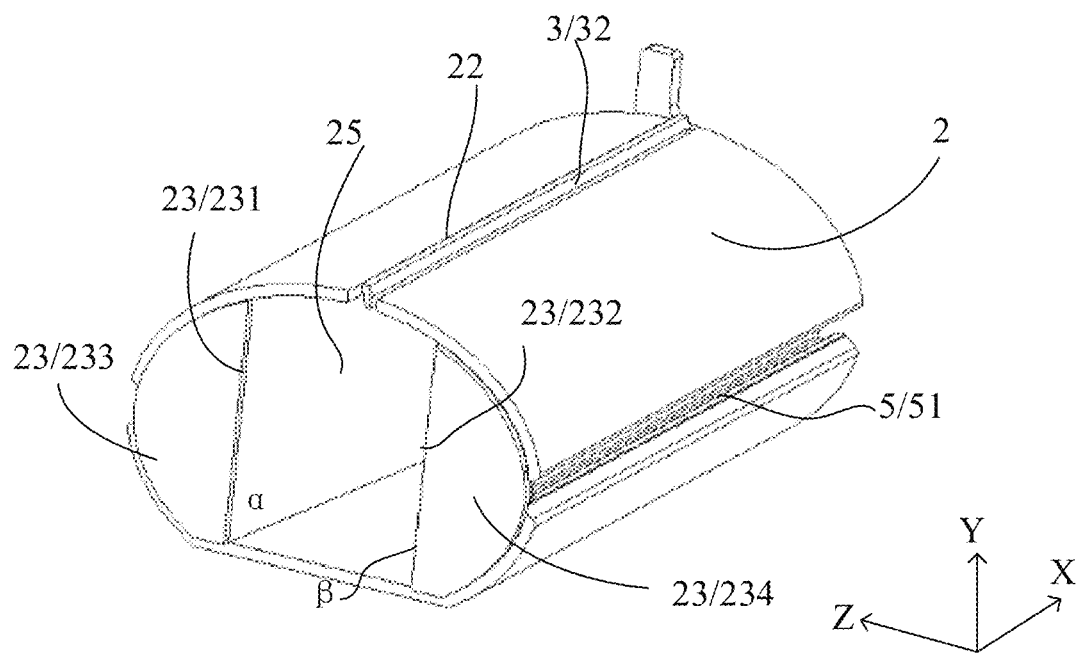
FIG. 5 is a schematic structural diagram of an inner housing according to an embodiment of the present disclosure.

FIG. 5 is a schematic structural diagram of the inner housing according to an embodiment of the present disclosure. Referring to FIG. 1, FIG. 2, FIG. 3, and FIG. 5, the inner housing 2 further includes an inner air duct 23. Along the first direction X, the inner air duct 23 is connected to the second air outlet 22. The inner air duct 23 includes a first end 23A and a second end 23B that are disposed opposite to each other. The first end 23A is located at a side of the second end 23B close to the first air inlet 11. A sectional area of the first end 23A along the second direction Y is greater than a sectional area of the second end 23B along the second direction Y.

In combination with FIG. 1, FIG. 2, FIG. 3, and FIG. 5, as mentioned earlier, the air volume at a position farther from the first air inlet 11 is smaller. Especially when the air outlet of the heat dissipation assembly 100 is relatively wide, the air volume at the second air outlet 22 of the heat dissipation assembly 100 far away from the first air inlet 11 may be insufficient. Based on this, the inner air duct 23 is provided in the inner housing 2 in the present disclosure. The inner air duct 23 is connected to the second air outlet 22. The inner air duct 23 includes the first end 23A and the second end 23B that are disposed opposite to each other. The first end 23A is located at the side of the second end 23B close to the first air inlet 11. The sectional area of the inner air duct 23 at the first end 23A along the second direction Y is greater than the sectional area of the inner air duct 23 at the second end 23B along the second direction Y. In some embodiments of the present disclosure, along the first direction X, the sectional area along the direction perpendicular to the first direction X of the inner air duct 23 progressively decreases from the first end 23A to the second end 23B. As the pressure of the air flow/stream is directly proportional to the air volume and inversely proportional to the sectional area, a decrease in the sectional area helps to enhance the pressure of the air flow. Therefore, along the first direction X, from the first end 23A to the second end 23B, the progressively decreased sectional area of the inner air duct 23 can compensate for a decrease in the air volume, allowing the second air outlet 22 to output cold air with certain strength throughout the entire width to better meet the heat dissipation requirement.

Figure 6:
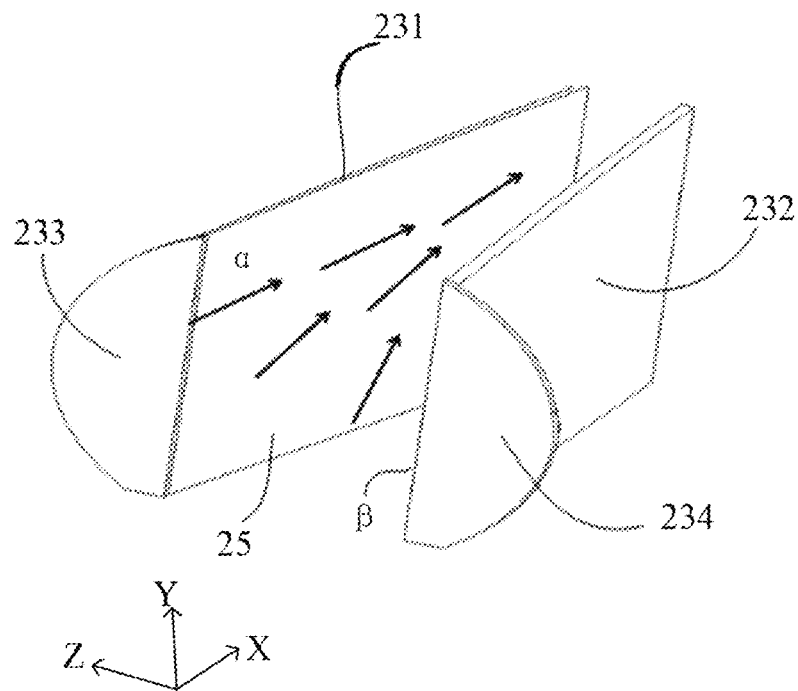
FIG. 6 is a schematic diagram of an inner air duct according to an embodiment of the present disclosure.

FIG. 6 is a schematic diagram of the inner air duct according to an embodiment of the present disclosure. As shown in FIG. 5 and FIG. 6, in some embodiments of the present disclosure, the inner air duct 23 includes a first baffle 231 and a second baffle 232 that are disposed opposite to each other along a third direction Z. The third direction Z crosses both the first direction X and the second direction Y. The first baffle 231 includes a first surface α facing the second baffle 232. The second baffle 232 includes a second surface β facing the first baffle 231. An included angle between a plane of the first surface a and a plane of the second surface β is γ, where $0°<γ<90°$. The second air outlet 22 is at least partially non-overlapping with the first baffle 231 or the second baffle 232 along the second direction Y.

As shown in FIG. 2, FIG. 3, FIG. 4, FIG. 5, and FIG. 6, in some embodiments of the present disclosure, when the inner housing 2 slides out for a long distance relative to the outer housing 1, the overlapping width of the first air outlet 13 and the second air outlet 22 is very small, and a distance between the other end (the remote end of the inner housing 2) of the inner housing 2 opposite to the second air inlet 21 and the first air inlet 11 is relatively long. In this case, the cold air enters the outer housing 1 from the first air inlet 11 and is transmitted towards the remote end of the inner housing 2 under the action of the pressure of the air flow. During the transmission, the cold air is continuously blown out of the first air outlet 13 and the second air outlet 22. Therefore, a position of the inner housing 2 closer to the remote end of the inner housing 2 has a smaller air volume. Based on this, referring to FIG. 5 and FIG. 6, the first baffle 231 and the second baffle 232 are arranged in the inner housing 2 in the present disclosure. The first baffle 231 includes the first surface α facing the second baffle 232. The second baffle 232 includes the second surface β facing the first baffle 231. The included angle between the plane of the first surface α and the plane of the second surface β is γ, where $0°<γ<90°$. The first baffle 231 and the second baffle 232 are disposed to ensure that the air duct of the inner housing 2 closer to the second end 23B of the inner housing is narrower. Similarly, a progressively narrower air duct can compensate for the reduced air volume, increasing the pressure of the air flow, and allowing the cold air to be smoothly transmitted to the remote end of the inner housing 2. In this way, the air outlet 22 at the remote end of the inner housing 2 can output the clod-blast air with the certain strength, to meet an overall width requirement for the air outlet of the heat dissipation assembly 100.

In some embodiments of the present disclosure, the angel γ may be in a range $8°<γ<30°$. A value of γ is associated with factors such as a length and a shape of the inner air duct 23, and may be adjusted based on actual needs.

Figure 7:
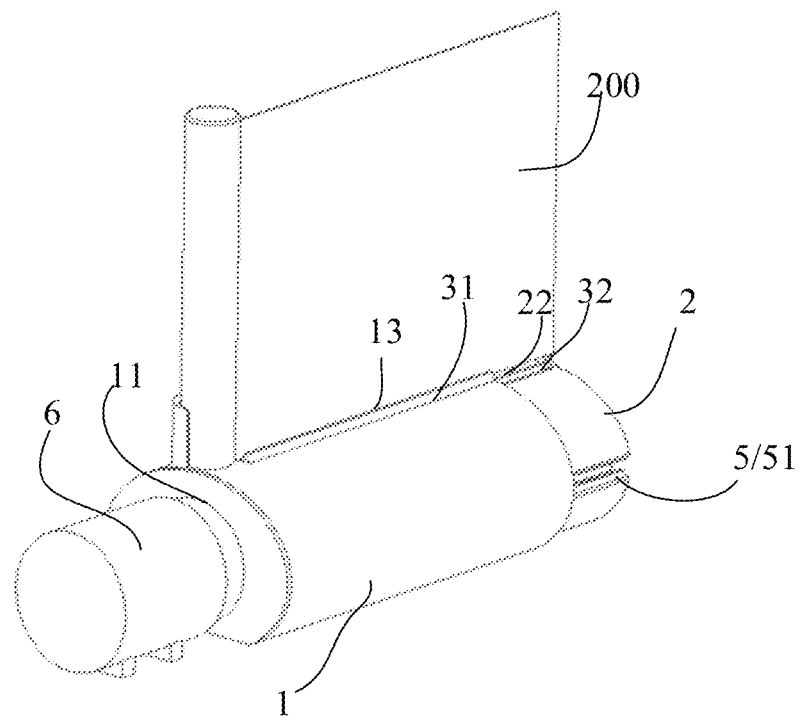
FIG. 7 is a schematic diagram of a heat dissipation apparatus connected with a display panel according to an embodiment of the present disclosure.

FIG. 7 is a schematic diagram of the heat dissipation apparatus according to an embodiment of the present disclosure. Referring to FIG. 7, in some embodiments of the present disclosure, the heat dissipation assembly 100 further includes a blow fan 6. The blow fan 6 is located at a side of the first air inlet 11 away from the installation port 12.

Still referring to FIG. 7, in the present disclosure, the blow fan 6 is arranged on the side of the first air inlet 11 away from the installation port 12. In this way, the cold air blown from the blow fan 6 enters the outer housing 1 and the inner housing 2 through the first air inlet 11. During transmission of the clod-blast air in the outer housing 1 and the inner housing 2, the cold air is outputted from the first air outlet 13 and the second air outlet 22 to dissipate the heat for the to-be-cooled object, for example, a display panel 200. In some embodiments of the present disclosure, the blow fan 6 may be a blower or a fan.

As shown in FIG. 1, FIG. 3, FIG. 4, FIG. 5, and FIG. 6, in some embodiments of the present disclosure, along the first direction X, the first end 23A of the inner air duct 23 includes a third air inlet 25. The third air inlet 25 is connected to the first air inlet 11. The third air inlet 25 is provided with an air blocking part. The air blocking part includes a first air blocking part 233 connected to the first baffle 231 and a second air blocking part 234 connected to the second baffle 232. At least one of the inner housing 2 and the outer housing 1 abuts against the air blocking part to form the third air inlet 25.

As shown in FIG. 1, FIG. 3, FIG. 4, FIG. 5, and FIG. 6, in some embodiments of the present disclosure, along the first direction X, each of the first baffle 231 and the second baffle 232 has two ends located at two ends of the inner housing 2 respectively. Along the second direction Y, both ends of each of the first baffle 231 and the second baffle 232 extend to the housing wall of the inner housing 2. The ends of the first baffle 231 and the second baffle 232 close to the first air inlet 11 and the housing wall of the inner housing 2 along the second direction Y together define the third air inlet 25. Along the third direction Z, the first baffle 231 and the second baffle 232 are located at two sides of the second air outlet 22. In other embodiments of the present disclosure, the first air blocking part 233 and the second air blocking part 234 are located outside of the inner housing 2, and the first air blocking part 233 and the second air blocking part 234 come into contact with the outer housing 1 to define the third air inlet 25. In this case, a shape of the third air inlet 25 is similar to a bell mouth.

When the heat dissipation assembly 100 works, the cold air enters the outer housing 1 from the first air inlet 11. When being transmitted along the first direction X, part of the cold air is blown out via the first air outlet 11. When the remaining cold air is transmitted to the inner housing 2, the cold air enters the inner air duct 23 via the third air inlet 25. When being transmitted in the inner air duct 23, the cold air is blown out via the corresponding second air outlet 22.

As shown in FIG. 3, FIG. 4, FIG. 5, and FIG. 6, the first air blocking part 233 and the second air blocking part 234 are provided in the present disclosure, which can prevent the cold air from flowing out via a gap between the inner air duct 23 and the housing wall of the inner housing 2. In this way, all the cold air enters the inner air duct 23 from the third air inlet 25, thereby strengthening the air flow in the inner air duct 23.

In some embodiments, the first air blocking part 233 and the first baffle plate 231 are formed into two pieces, and are fixedly connected using screws or other fasteners. In some other embodiments, the first air blocking part 233 and the first baffle plate 231 are formed into one piece, and are integrally formed with a natural connection by means of injection molding, sheet metal, or the like. Similarly, the second baffle 232 and the second air blocking part 234 may be formed into two pieces, and are fixedly connected. The second baffle 232 and the second air blocking part 234 may alternatively be formed integrally into one piece. This is not limited in the present disclosure.

In some embodiments of the present disclosure, the inner air duct 23 is composed of merely the first baffle 231 and the second baffle 232 arranged on the inner housing 2 and is used to gather the air flow and increase the wind force. This design is simple and easy to implement. Such is an example structure of the inner air duct 23, and the inner air duct 23 of the present disclosure is not limited to this structure. Any other structure capable of gathering the air flow can be applied to the present disclosure. For example, the inner air duct 23 and the inner housing 2 are formed into two pieces and fixedly connected. For another example, an overall structure of the inner air duct 23 is like a cylinder with a polygonal cross section, a circular cross section, or an irregular cross section.

As shown in FIG. 1, FIG. 2, FIG. 4, and FIG. 5, in some embodiments of the present disclosure, the heat dissipation assembly 100 includes an exit-air regulating structure 3 located at at least one of the first air outlet 13 and the second air outlet 22. The exit-air regulating structure 3 includes a rotating shaft and is pivotable around the rotating shaft. The rotating shaft extends along the first direction.

As shown in FIG. 1, FIG. 2, FIG. 4, FIG. 5, and FIG. 7, the display panel 200 has a certain height in the second direction Y. In order to maximize heat dissipation uniformity of the display panel 200 in the second direction Y, the exit-air regulating structure is provided at the first air outlet 13 and/or the second air outlet 22. In this way, the pressure of the air flow and the direction of the air flow at the first air outlet 13 and/or the pressure of the air flow and the direction of the air flow at the second air outlet 22 can be changed by adjusting the pivoting angle of the exit-air regulating structure 3 at the first air outlet 13 and/or the second air outlet 22. In this way, the air flow at the first air outlet 13 and/or the second air outlet 22 can be blown farther to cool an upper part of the display panel, or the air flow just reaches a lower part of the display panel so as to quickly cool the lower part of the display panel. Therefore, the heat dissipation assembly 100 with the exit-air regulating structure in the present disclosure can adjust the direction and the pressure of the air flow according to a target heat dissipation region of the to-be-cooled object, such that the to-be-cooled object is cooled more evenly along the second direction Y. This avoids a local temperature that is too high or too low, and improves working reliability of the to-be-cooled object.

Figure 8:
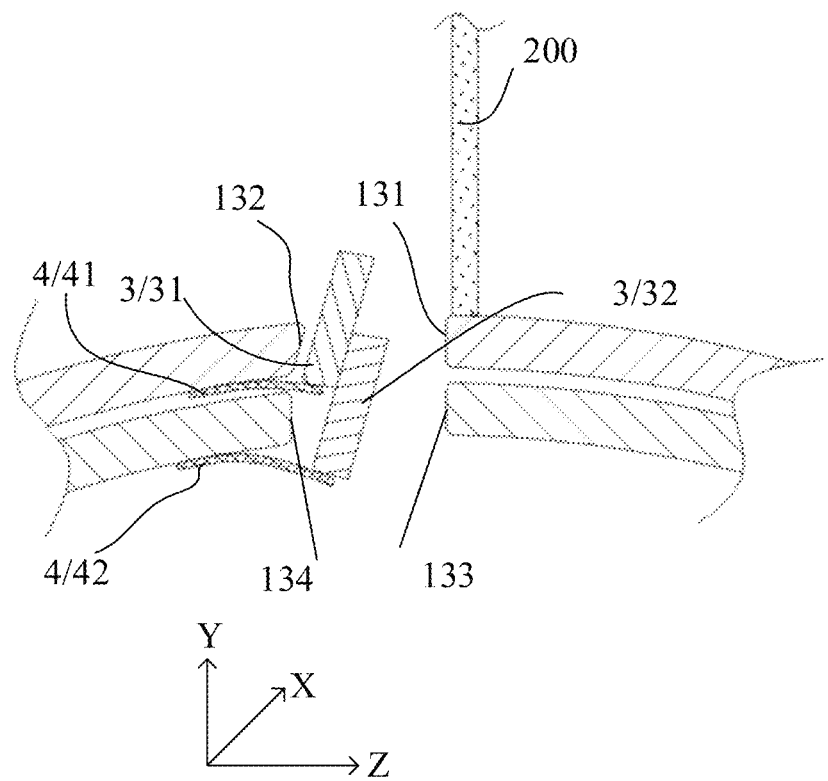
FIG. 8 is a schematic structural diagram of an exit-air regulating structure of a heat dissipation assembly according to an embodiment of the present disclosure.

FIG. 8 is a schematic structural diagram of the exit-air regulating structure of the heat dissipation assembly according to an embodiment of the present disclosure. Referring to FIG. 8, in some embodiments of the present disclosure, the first air outlet 13 includes a first sidewall 131 and a second sidewall 132 that are opposite to each other along the third direction Z. The exit-air regulating structure 3 is at least provided at the first air outlet 13. The third direction Z crosses both the first direction X and the second direction Y. The heat dissipation assembly 100 includes a drive device, and the exit-air regulating structure 3 pivots towards or away from the first sidewall 131 under the action of the drive device.

Still referring to FIG. 8, in some embodiments, the first air outlet 13 is located on the housing wall of the outer housing 1. The first air outlet 13 is an opening on the outer housing 1 and extends along the first direction X. Along the third direction Z, the first air outlet 13 is a gap between the first sidewall 131 and the second sidewall 132, and the exit-air regulating structure 3 may be provided at least at the first air outlet 13. In some embodiments, the exit-air regulating structure 3 also extends along the first direction X, and a length of the exit-air regulating structure 3 along the first direction X is approximately the same as a length of the first air outlet 13 along the first direction X.

Still referring to FIG. 8, the reference numeral 200 in FIG. 8 represents the display panel. The display panel is the to-be-cooled object. Of course, the to-be-cooled object may be other apparatuses. In order to make the air flow be concentrated, the exit-air regulating structure 3 in the present disclosure is generally disposed adjacent to the second sidewall 132, while the to-be-cooled object, such as the display panel 200, is disposed on the housing at the first sidewall 131. In this way, a gap between the exit-air regulating structure 3 and the first sidewall 131 becomes a main air exiting part of the first air outlet 13.

In the present disclosure, the exit-air regulating structure 3 is disposed at least at the first air outlet 13, and pivots towards or away from the first sidewall 131 under the action of the drive device. Therefore, a size of the main air exiting part of the first air outlet 13 can be adjusted through the exit-air regulating structure 3. As shown in FIG. 8, when the exit-air regulating structure 3 pivots towards the first sidewall 131, the gap between the exit-air regulating structure 3 and the first sidewall 131 decreases, and an included angle between the exit-air regulating structure 3 and the first sidewall 131 also decreases. In this case, the pressure of the air flow increases. In the third direction Z, the air flows shorter, and the cooled part is mainly concentrated in a region close to the first air outlet 13 on the to-be-cooled object. When the exit-air regulating structure 3 pivots away from the first sidewall 131, the gap between the exit-air regulating structure 3 and the first sidewall 131 increases, and the included angle between the exit-air regulating structure 3 and the first sidewall 131 also increases. In this case, the pressure of the air flow decreases. In the third direction Z, the air flows higher, and the cooled part covers a region of the to-be-cooled object far away from the first air outlet 13. In this way, the exit-air regulating structure 3 is disposed at least at the first air outlet 13 in the present disclosure. The exit-air regulating structure 3 can be used to dissipate heat both in the region of the to-be-cooled object close to the first air outlet 13 and in the region of the to-be-cooled object far away from the first air outlet 13, thereby improving the working reliability of the to-be-cooled object.

Still referring to FIG. 8, in some embodiments of the present disclosure, the exit-air regulating structure 3 includes a first exit-air regulating structure 31 and a second exit-air regulating structure 32. The first exit-air regulating structure 31 corresponds to the first air outlet 13, and the second exit-air regulating structure 32 corresponds to the second air outlet 22. Along the third direction Z, the second air outlet 22 includes a third sidewall 133 and a fourth sidewall 134 that are opposite to each other. The first exit-air regulating structure 31 is at least partially located between the first sidewall 131 and the second sidewall 132, and the second air outlet 22 is at least partially located between the third sidewall 133 and the fourth sidewall 134. The second exit-air regulating structure 32 is located between the first exit-air regulating structure 31 and the third sidewall 133. At least one of the first exit-air regulating structure 31 and the second exit-air regulating structure 32 is connected to the drive device.

Still referring to FIG. 8, the exit-air regulating structure 3 is disposed at both the first air outlet 13 and the second air outlet 22 in the present disclosure. The first exit-air regulating structure 31 is at least partially located between the first sidewall 131 and the second sidewall 132, and the second exit-air regulating structure 32 is located between the first exit-air regulating structure 31 and the third sidewall 133. Therefore, no matter whether the inner housing 2 is located in the outer housing 1 or the inner housing 2 extends out relative to the outer housing 1, for the heat dissipation assembly 100 as a whole, the pressures and the directions of the air flow at the first air outlet 13 and the second air outlet 22 can be adjusted, regardless of the length of the overlapping width of the first air outlet 13 and the second air outlet 22 along the first direction. This allows better adjustment of the corresponding pressure and direction of the air flow based on a heat dissipation requirement of the to-be-cooled object, ensuring a suitable working temperature for the to-be-cooled object.

Figure 9:
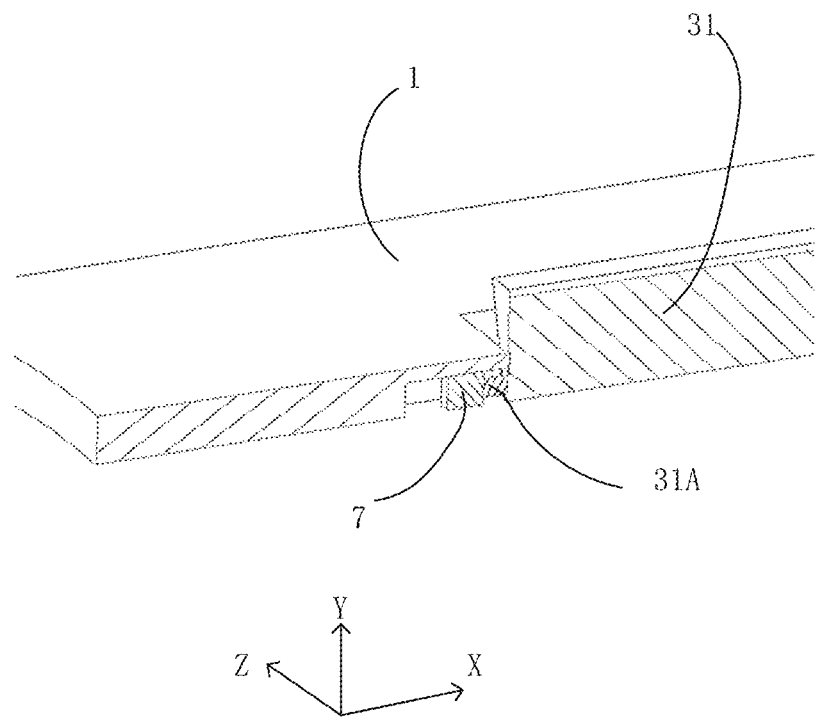
FIG. 9 is a schematic diagram of a first exit-air regulating structure according to an embodiment of the present disclosure.

FIG. 9 is a schematic diagram of installing the first exit-air regulating structure according to an embodiment of the present disclosure. Referring to FIG. 9, FIG. 1 and FIG. 2, the first exit-air regulating structure 31 in the present disclosure may be of a plate shape. A rotating shaft 31A is fixedly disposed at one end of the first exit-air regulating structure 31 and close to the first air outlet 11. The drive device 7 is disposed in the outer housing 1 to drive the rotating shaft 31A to rotate. In this way, the first exit-air regulating structure 31 can pivot.

Figure 10:
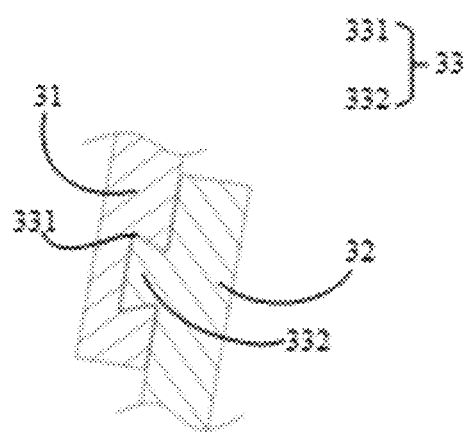
FIG. 10 is a schematic diagram of a linkage structure on a first exit-air regulating structure and a second exit-air regulating structure according to an embodiment of the present disclosure.

FIG. 10 is a schematic diagram of the linkage structure on the first exit-air regulating structure and the second exit-air regulating structure according to an embodiment of the present disclosure. Referring to FIG. 10, in some embodiments of the present disclosure, the first exit-air regulating structure 31 and the second exit-air regulating structure 32 includes a linkage structure 33. The linkage structure 33 includes a groove 331 and a protrusion 332 that are engaged with each other. The groove 331 is disposed on one of the first exit-air regulating structure 31 and the second exit-air regulating structure 32. The protrusion 332 is disposed on the other one of the first exit-air regulating structure 31 and the second exit-air regulating structure 32.

As shown in FIG. 8, FIG. 9, and FIG. 10, in some embodiments of the present disclosure, the linkage structure 33 is disposed on the first exit-air regulating structure 31 and the second exit-air regulating structure 32. The linkage structure 33 includes the groove 331 and the protrusion 332 that are engaged with each other. Therefore, when the first exit-air regulating structure 31 pivots, the second exit-air regulating structure 32 also pivots along with the first exit-air regulating structure 31. In this way, the exit-air regulating structure 3 is driven by only directly driving the first exit-air regulating structure 31 or the second exit-air regulating structure 32. Therefore, with the linkage structure 33 disposed on the first exit-air regulating structure 31 and the second exit-air regulating structure 32, a quantity of drive devices is reduced, and the structure of the heat dissipation assembly 100 is simplified, making the heat dissipation assembly 100 more energy-efficient.

Figure 11:
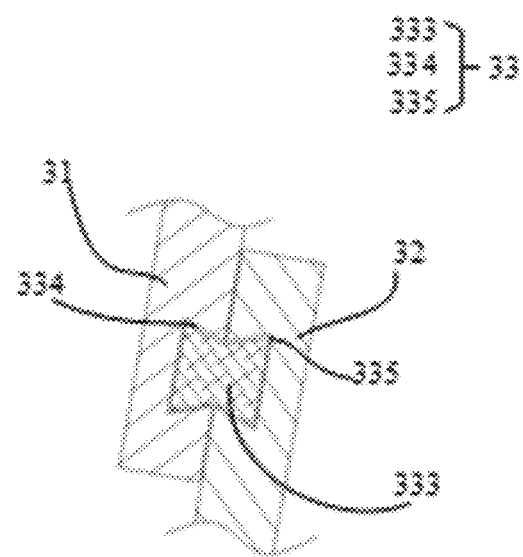
FIG. 11 is another schematic diagram of a linkage structure on a first exit-air regulating structure and a second exit-air regulating structure according to an embodiment of the present disclosure.

FIG. 11 is another schematic diagram of the linkage structure on the first exit-air regulating structure and the second exit-air regulating structure according to an embodiment of the present disclosure. In some embodiments of the present disclosure, the heat dissipation assembly 100 includes a linkage structure 33 including a guide rail 333 and a groove. The groove includes a first groove 334 located in the first exit-air regulating structure 31 and a second groove 335 located in the second exit-air regulating structure 32. The guide rail 333 is located between the first exit-air regulating structure 31 and the second exit-air regulating structure 32. The first groove 334 and the second groove 335 are separately engaged with the guide rail 333.

Still referring to FIG. 11, the linkage structure 33 is disposed on the first exit-air regulating structure 31 and the second exit-air regulating structure 32 in the present disclosure. The exit-air regulating structure 3 is driven by only driving the first exit-air regulating structure 31 or the second exit-air regulating structure 32. Therefore, the linkage structure 33 disposed on the first exit-air regulating structure 31 and the second exit-air regulating structure 32 in the present disclosure can reduce a quantity of drive devices and simplify the structure of the heat dissipation assembly 100, making the heat dissipation assembly 100 more energy-efficient.

In addition, in some embodiments of the present disclosure, main bodies of the first exit-air regulating structure 31 shown in FIG. 10 and the second exit-air regulating structure 32 shown in FIG. 11 are both rectangular plates. Along the first direction, the groove 331 and the protrusion 332 shown in FIG. 9, as well as the first groove 334 and the second groove 335 shown in FIG. 10, extend from one end of the rectangular plate to the other end of the rectangular plate. Therefore, the protrusion 332 can be inserted into the first groove from one end of the first groove 331. This facilitates engagement of the groove 331 and the protrusion 332, and also facilitates engagement between the guide rail 333 and the first groove 334 and the second groove 335. In some embodiments of the present disclosure, the groove 331, the first groove 334, and the second groove 335 are all dovetail grooves. On the one hand, the dovetail groove can be easily processed. On the other hand, there is sufficient force between the dovetail groove and its matching dovetail-shaped protrusion to prevent the first exit-air regulating structure 31 and the second exit-air regulating structure 32 disengaging during rotation.

In addition, still referring to FIG. 10 or FIG. 11, when the linkage structure 33 is disposed on the first exit-air regulating structure 31 and the second exit-air regulating structure 32, the drive device may include one or two motors. When there is one motor, the motor has two functions: forward rotation and reverse rotation. During the forward rotation, the first exit-air regulating structure 31 and the second exit-air regulating structure 32 pivot towards one direction. During the reverse rotation, the first exit-air regulating structure 31 and the second exit-air regulating structure 32 pivot towards the other direction.

Figure 12:
FIG. 12 is a schematic structural diagram of a drive device according to an embodiment of the present disclosure.

FIG. 12 is a schematic structural diagram of the drive device according to an embodiment of the present disclosure. As shown in FIG. 9 and FIG. 10, or FIG. 11 and FIG. 12, when the drive device 7 includes two motors, the drive device 7 includes a first motor 41 and a second motor 42. The first motor 41 only outputs forward rotation, and the first motor 41 is connected to the first exit-air regulating structure 31 to drive the first exit-air regulating structure 31 to pivot towards the first sidewall 131. Under the action of the linkage structure 33, the second exit-air regulating structure 32 pivots towards the first sidewall 131 along with the pivoting of the first exit-air regulating structure 31. The second motor 42 only outputs reverse rotation, and the second motor 42 is connected to the second exit-air regulating structure 32 to drive the second exit-air regulating structure 32 to pivot towards a direction away from the first sidewall 131. Under the action of the linkage structure 33, the first exit-air regulating structure 31 pivots towards the direction away from the first sidewall 131 along with the pivoting of the second exit-air regulating structure 32.

As shown in FIG. 8 and FIG. 12, in other embodiments of the present disclosure, without additionally arranging the linkage structure 33 on the first exit-air regulating structure 31 and the second exit-air regulating structure 32, linkage can also be achieved between the first exit-air regulating structure 31 and the second exit-air regulating structure 32. A specific implementation is as follows. Along the third direction Z, the first exit-air regulating structure 31 is located at a side of the second exit-air regulating structure 32 adjacent to the first sidewall 131, and the second exit-air regulating structure 32 is in contact with the first exit-air regulating structure 31. The drive device 7 includes a first motor 71 and a second motor 72. The first motor 71 is connected to the first exit-air regulating structure 31, and the second motor 72 is connected to the second exit-air regulating structure 32. In this way, when the first motor 71 works and the second motor 72 does not work, the first motor 71 drives the first exit-air regulating structure 31 to pivot towards the first sidewall 131. Since the second exit-air regulating structure 32 is located at the side of the first exit-air regulating structure 31 adjacent to the first sidewall 131, the second exit-air regulating structure 32 also pivots towards the first sidewall 131 under the action of the first exit-air regulating structure 31. When the second motor operates and the first motor does not operate, the second motor drives the second exit-air regulating structure 32 to pivot away from the first sidewall. Because the first exit-air regulating structure 32 is located at a side of the second exit-air regulating structure 32 away from the first sidewall, the first exit-air regulating structure 32 also pivots away from the first sidewall under the action of the second exit-air regulating structure 32. In this embodiment, the first exit-air regulating structure 31 and the second exit-air regulating structure 32 have a simple structure. In addition, during the adjustment of the direction of the air flow, only one motor of the drive device needs to be turned on, and the other motor may not work. This saves an energy consumption and reduces noise during heat dissipation.

In some embodiments of the present disclosure, the drive device includes a first drive device and a second drive device. The first drive device is connected to the first exit-air regulating structure 31, and the second drive device is connected to the second exit-air regulating structure 32.

Still referring to FIG. 1, FIG. 2, FIG. 8, FIG. 11, and FIG. 12, in some embodiments of the present disclosure, the drive device includes the first drive device and the second drive device. The first drive device is connected to the first exit-air regulating structure 31, and the second drive device is connected to the second exit-air regulating structure 32. In this way, when there is no linkage relationship between pivoting of the first exit-air regulating structure 31 and pivoting of the second exit-air regulating structure 32, the first exit-air regulating structure 31 and the second exit-air regulating structure 32 are adjusted separately. In this case, the first drive device and the second drive device can respectively drive the first exit-air regulating structure 31 and the second exit-air regulating structure 32 to pivot synchronously. In some embodiments, based on the heat dissipation requirement of the to-be-cooled object, the first exit-air regulating structure 31 and the second exit-air regulating structure 32 may pivot by different angles. Generally, because the second air outlet 22 has a certain distance to the first air inlet 11, in some embodiments of the present disclosure, a gap between the second exit-air regulating structure 32 and the first sidewall 131 may be smaller when they pivot in a same direction. Therefore, the present disclosure can flexibly adjust the pressure and the direction of the air flow at the first air outlet 13 and the second air outlet 22 by disposing the first drive device connected to the first exit-air regulating structure 31 and the second drive device connected to the second exit-air regulating structure 32, to meet the heat dissipation requirement of the to-be-cooled object more easily.

In some embodiments of the present disclosure, the heat dissipation assembly 100 includes a third working state. In the third working state, there is an air regulating angle θ between a plane of the first exit-air regulating structure 31 and a plane of the second exit-air regulating structure 32, where 0°<θ<90°.

Figure 13:
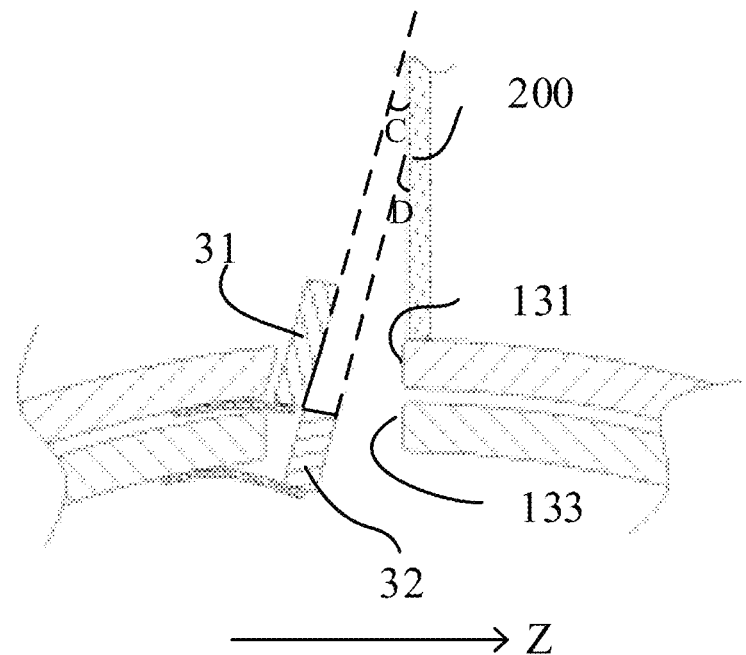
FIG. 13 is a schematic structural diagram of an exit-air regulating structure of a heat dissipation assembly according to an embodiment of the present disclosure.

FIG. 13 is a schematic structural diagram of the exit-air regulating structure of the heat dissipation assembly according to an embodiment of the present disclosure. In some embodiments of the present disclosure, an included angle formed by a surface of the first exit-air regulating structure 31 close to the display panel 200 (the to-be-cooled object) and a surface of the display panel 200 close to the first exit-air regulating structure 31 is ∠C. An included angle formed by a surface of the second exit-air regulating structure 32 close to the display panel 200 (the to-be-cooled object) and a surface of the display panel 200 close to the second exit-air regulating structure 32 is ∠D. The angle ∠D is less than the angle ∠C, and a difference between the angle ∠D and the angle ∠C is equal to the air regulating angle θ between the plane of the first exit-air regulating structure 31 and the plane of the second exit-air regulating structure 32. According to the present disclosure, the air regulating angle θ is included between the plane of the first exit-air regulating structure 31 and the plane of the second exit-air regulating structure 32. In this way, the included angle formed by the surface of the first exit-air regulating structure 31 close to the display panel 200 (the to-be-cooled object) and the surface of the display panel 200 close to the first exit-air regulating structure 31 is relatively large, and the included angle formed by the surface of the second exit-air regulating structure 32 close to the display panel 200 (the to-be-cooled object) and the surface of the display panel 200 close to the second exit-air regulating structure 32 is relatively small. This can compensate for the amount and strength of the air flow at the second exit-air regulating structure 32 to avoid insufficient air flow at the second exit-air regulating structure 32, and better ensure a heat dissipation effect of the to-be-cooled object.

Still referring to FIG. 8 and FIG. 13, in some embodiments of the present disclosure, the heat dissipation assembly 100 further includes a sealing member 4 configured to seal a gap between the exit-air regulating structure 13 and one sidewall of the first air outlet 13, and/or to seal a gap between the exit-air regulating structure 3 and one sidewall of the second air outlet 22.

Still referring to FIG. 8 and FIG. 13, in some embodiments of the present disclosure, in order to ensure that the exit-air regulating structure 3 can pivot normally and do not interfere with the sidewall of the first air outlet 13 and/or the sidewall of the second air outlet 22, there is a certain gap between the exit-air regulating structure 3 and the sidewall. As shown in FIG. 8 and FIG. 13, the gap between the first exit-air regulating structure 31 and the second sidewall 132, and the gap between the second exit-air regulating structure 32 and the fourth sidewall 134 are all air leakage gaps. In order to prevent air from blowing out from the air leakage gap to affect the heat dissipation effect, the present disclosure provides a first sealing member 41 at the first exit-air regulating structure 31 and a second sealing member 42 at the second exit-air regulating structure. The first sealing member 41 is configured to seal the gap between the first exit-air regulating structure 31 and the second sidewall 132, and the second sealing member 42 is configured to seal the gap between the second exit-air regulating structure 32 and the fourth sidewall 134. In this way, the present disclosure can avoid air leakage at the air leakage gap by disposing the sealing members, thereby ensuring effective air flow at the first air outlet 13 and the second air outlet 22, ensuring the heat dissipation effect, and improving cooling efficiency.

Figure 14:
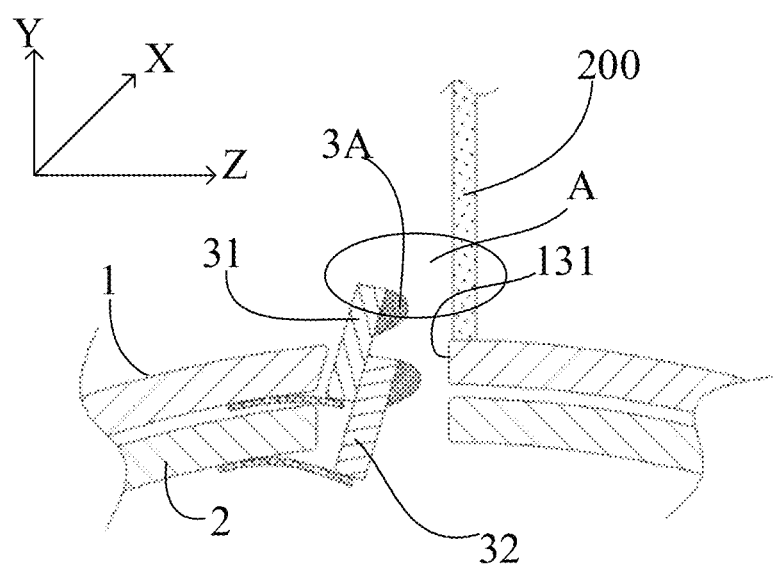
FIG. 14 is a schematic structural diagram of an exit-air regulating structure of a heat dissipation assembly according to an embodiment of the present disclosure.
Figure 15:
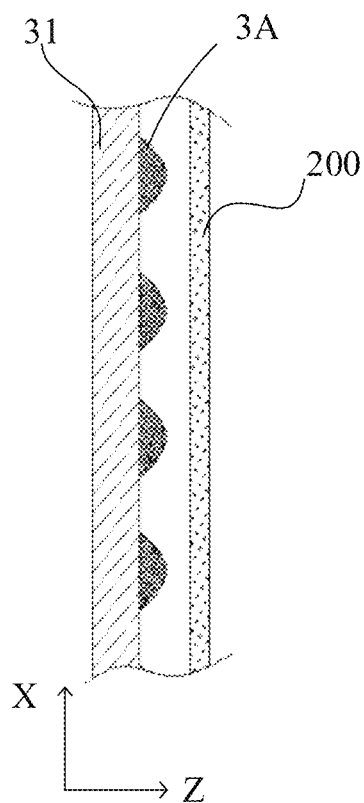
FIG. 15 is a top view of a region A in FIG. 14 according to an embodiment of the present disclosure.
Figure 16:
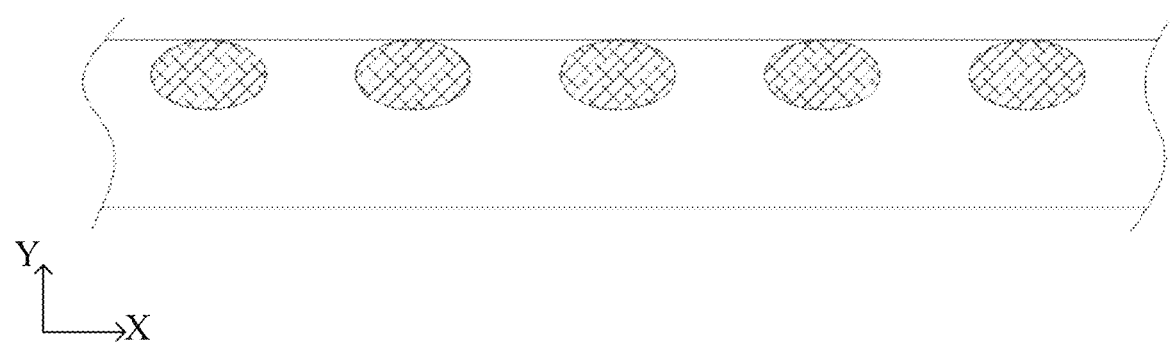
FIG. 16 is a schematic diagram of the exit-air regulating structure provided in FIG. 14 according to an embodiment of the present disclosure.

FIG. 14 is a schematic structural diagram of the exit-air regulating structure of the heat dissipation assembly according to an embodiment of the present disclosure. FIG. 15 is a top view of a region A in FIG. 14. FIG. 16 is a schematic diagram of the exit-air regulating structure provided in FIG. 14. Referring to FIG. 14 to FIG. 16, along the third direction Z, the first exit-air regulating structure 31 and/or the second exit-air regulating structure 32 is provided with a convex block 3A on a surface close to the first sidewall 131.

Still referring to FIG. 14 to FIG. 16, along the third direction Z, the heat dissipation assembly 100 in the present disclosure is provided with the convex block 3A on the surface of the first exit-air regulating structure 31 close to the first sidewall 131 and/or the convex block 3A on the surface of the second exit-air regulating structure 32 close to the first sidewall 131. Therefore, along the third direction Z, a distance between the first exit-air regulating structure 31 and the first sidewall 131 and a distance between the second exit-air regulating structure 32 and the first sidewall 131 both decrease due to the presence of the convex block 3A. In addition, referring to FIG. 15 and FIG. 16, the first exit-air regulating structure 31 and the second exit-air regulating structure 32 may each be provided with a row of convex blocks 3A. Therefore, along the first direction X, the air flow is relatively strong at the position where the convex block 3A is disposed, thereby enhancing the air flow at the first air outlet 13 or the second air outlet 22 and accelerating heat dissipation of the display panel 200.

In addition, in some embodiments of the present disclosure, the convex block 3A may be disposed on both the surface of the first exit-air regulating structure 31 close to the first sidewall 131 and the surface of the second exit-air regulating structure 32 close to the first sidewall 131, or the convex block 3A may be disposed only on the surface of the second exit-air regulating structure 32 close to the first sidewall 131. This can compensate for air flow reduction due to a large distance between the second air outlet 22 and the first air inlet 13.

It should be noted that FIG. 14, FIG. 15, and FIG. 16 only provide examples of disposing a row of convex blocks 3A on the surface of the first exit-air regulating structure 31 close to the first sidewall 131 and the surface of the second exit-air regulating structure 32 close to the first sidewall 131. In other embodiments, two or more rows of convex blocks 3A may be disposed based on a size of the first air outlet 13, a size of the second air outlet 22, and power of the blow fan.

As shown in FIG. 1, FIG. 2, and FIG. 5, in some embodiments of the present disclosure, the heat dissipation assembly further includes a sliding structure 5 provided between the inner housing 1 and the outer housing 2. The sliding structure 5 extends along the first direction X. The sliding structure 5 includes a sliding rail and a chute 51 that are slidably matched with each other. The sliding rail is disposed on one of an outer wall of the inner housing 2 and an inner wall of the outer housing 1, and the chute 51 is disposed on the other one of the outer wall of the inner housing 2 and the inner wall of the outer housing 1.

Still referring to FIG. 1, FIG. 2, and FIG. 5, in some embodiments of the present disclosure, the inner housing 2 is connected to the outer housing 1 through the sliding structure 5. Therefore, when the to-be-cooled object requires a small heat dissipation width, the inner housing 2 may be sleeved in the outer housing 1. In this case, as shown in FIG. 1, the width of the air outlet of the heat dissipation assembly 100 is the width of the first air outlet 13. When the to-be-cooled object requires a large heat dissipation width, the inner housing 2 may slide with respect to the outer housing 1 through the sliding structure 5 such that the inner housing 2 is outside of the outer housing 1. In this case, as shown in FIG. 2, the width of the air outlet of the heat dissipation assembly 100 is approximately equal to the sum of the width of the first air outlet 13 and the width of the second air outlet 22. In addition, when it is needed to reduce the width of the air outlet of the heat dissipation assembly 100, the inner housing 22 may slide into the inner housing 1 through the sliding structure 5. The present disclosure changes the width of the air outlet of the heat dissipation assembly 100 through the sliding of the inner housing 2. In this process, the sliding structure 5 plays a role in reducing friction force between the inner housing 2 and the outer housing 1 and also plays a guiding role. Therefore, with the sliding structure 5 between the inner housing 2 and the outer housing 1 of the heat dissipation assembly 100, the present disclosure allows easier and more accurate adjustment of the width of the air outlet of the heat dissipation assembly 100. In addition, the present disclosure has a simple structure with the help of disposing sliding structures on the inner wall of the outer housing 1 and the outer wall of the inner housing 2.

It should be noted that there are two sliding structures 5 shown in FIG. 2 and FIG. 5, which are symmetrically disposed on two sides of the second air outlet 22 along the third direction Z. This can enhance connection reliability between the inner housing 2 and the outer housing 1. However, the position of the sliding structure 5 in the present disclosure is not limited to the positions shown in FIG. 2 and FIG. 5. There may be one or more sliding structures 5. For example, in some embodiments, along the second direction Y, the sliding structure 5 may be located at a position opposite to the second air outlet 22.

Figure 17:
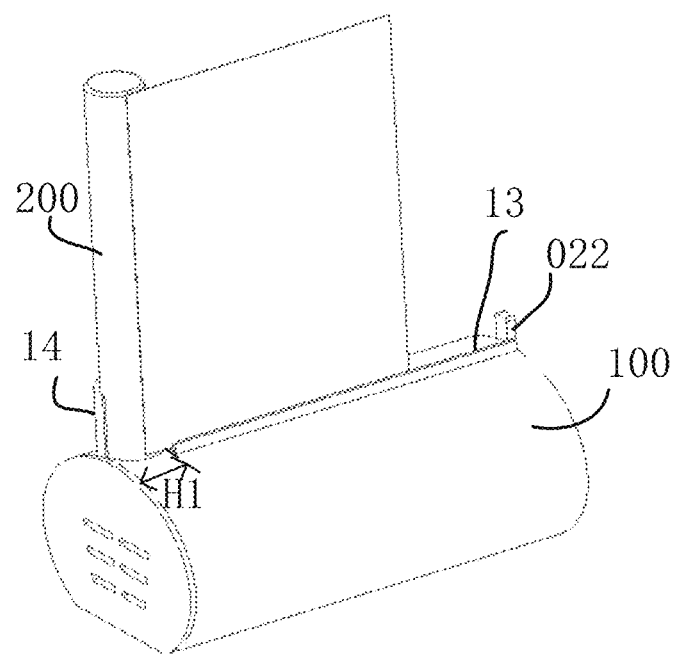
FIG. 17 is a schematic structural diagram of a display apparatus according to an embodiment of the present disclosure.
Figure 18:
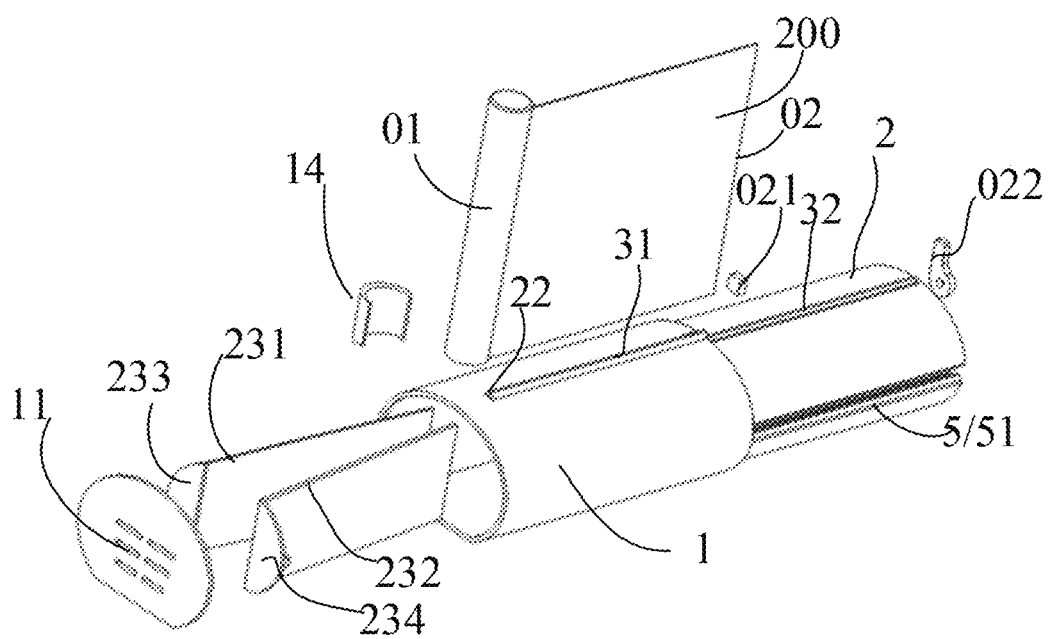
FIG. 18 is a schematic exploded diagram of a display apparatus according to an embodiment of the present disclosure.

FIG. 17 is a schematic structural diagram of a display apparatus according to an embodiment of the present disclosure. FIG. 18 is an exploded view of a display apparatus according to an embodiment of the present disclosure. The present disclosure further provides a display apparatus, including a display panel 200 and the heat dissipation assembly 100 as described above. Along the second direction Y, the display panel 200 is located at one side of the first air outlet 13. The heat dissipation assembly 100 is configured to dissipate heat generated by the display panel 200.

In combination with FIG. 1, FIG. 2, FIG. 7, FIG. 14, FIG. 17, and FIG. 18, the display apparatus in the present disclosure adopts the heat dissipation assembly 100, and the display panel 200 is located at one side of the first air outlet 13. The heat dissipation assembly 100 and the display panel 200 are independent in their respective structures. The heat dissipation assembly 100 and the display panel 200 have good structural independence and high reliability. In addition, the inner housing 2 of the heat dissipation assembly in the present disclosure may be located in the outer housing 1. Therefore, the display apparatus in the present disclosure has a small volume and is easy portability. In addition, due to an adjustable width, adjustable air flow, and an adjustable air flow direction of the air outlet, the heat dissipation assembly 100 in the present disclosure can ensure that the display panel 200 in the present disclosure is within a normal operating temperature range. Therefore, the display apparatus in the present disclosure has good working performance and reliability. Finally, the display apparatus in the present disclosure has other beneficial effects of the heat dissipation assembly 100 provided in the embodiments of the present disclosure. Reference may be made to the specific descriptions of the heat dissipation assembly 100 in the above embodiments, and details are not repeated again herein.

Still referring to FIG. 7, FIG. 17, and FIG. 18, in some embodiments of the present disclosure, the display apparatus includes a first working mode. In the first working mode, at least one side edge of the display panel 200 extends along the first direction X.

Still referring to FIG. 7, FIG. 17, and FIG. 18, the display apparatus in the present disclosure includes the first working mode. In the first working mode, at least one side edge of the display panel 200 extends along the first direction X. Both the first air outlet 13 and the second air outlet 22 of the heat dissipation assembly 100 in the present disclosure also extend along the first direction X. Therefore, the heat dissipation assembly 100 can better dissipate heat for the display panel 200.

Further, the display panel generally includes a driver chip, which generates a largest amount of heat. Therefore, in some embodiments of the present disclosure, along the second direction Y, the driver chip is disposed at a lower part of the display panel 200. When the display panel 200 is combined with the heat dissipation assembly 100, the lower part of the display panel 200 is close to the heat dissipation assembly, which makes it more convenient to dissipate heat for the driver chip.

In some embodiments of the present disclosure, pivoting of the first exit-air regulating structure 31 and the second exit-air regulating structure 32 can be adjusted based on a temperature of a region of the display panel 200 close to the heat dissipation assembly 100 along the second direction Y and a temperature of a region of the display panel 200 away from the heat dissipation assembly 100 along the second direction Y, thereby changing the air flow direction at the air outlet to enable the heat dissipation assembly 100 to effectively dissipate heat for a high-temperature region and ensure normal operation of the display panel 200. For example, when a temperature of a upper region of the display panel (in other words, the region away from the heat dissipation assembly 200) is higher than a set value, the drive device drives the first exit-air regulating structure 31 and/or the second exit-air regulating structure 32 to pivot inwardly together, and the heat dissipation assembly 100 outputs an air flow with higher speed that can reach a farther region, which can dissipate heat for the upper region of the display panel. When the temperature of the upper region of the display panel 200 is lower than the set value, the drive device drives the first exit-air regulating structure 31 and/or the second exit-air regulating structure 32 to pivot outwardly together. In this case, the heat dissipation assembly 100 mainly dissipates heat for the driver chip arranged in the lower region of the display panel.

Still referring to FIG. 7, FIG. 17, and FIG. 18, in some embodiments of the present disclosure, the display panel 200 is a flexible display panel, and includes rolled and unrolled (folded/unfolded) states. Along the first direction X, the flexible display panel includes a fixed end 01 and a movable end 02. The fixed end 01 is fixedly connected to the outer housing 1, and the movable end 02 can move relative to the fixed end 01 along the first direction X to unroll/unfold the flexible display panel. The movable end 02 is provided with a first magnet 021. Along the first direction X, an end of the inner housing 2 opposite to the first air inlet 13 is provided with a second magnet 022, and the second magnet 022 is located on a movement path of the first magnet 021.

When the display panel 200 is the flexible display panel, the display panel 200 includes the rolled and unrolled states. In this case, a size of the display panel 200 in the first direction and the overlapping width of the first air outlet 13 and the second air outlet 22 can be adjusted based on an unrolled width of the display panel 200, such that the width of the air outlet of the heat dissipation assembly 100 matches a to-be-cooled region of the flexible display panel. The first magnet 021 is disposed at the movable end 02 in the present disclosure. Along the first direction X, the end of the inner housing 2 opposite to the first air inlet 13 is provided with the second magnet 022. The second magnet 022 is located on the movement path of the first magnet 021. In this way, as shown in FIG. 1, FIG. 2, FIG. 17, and FIG. 18, in some embodiments of the present disclosure, along the first direction X, during the process of unrolling/unfolding the flexible display panel, when the first magnet 021 of the movable end 02 of the flexible display panel meets the second magnet 022 of the inner housing 1, the first magnet 021 and the second magnet 022 generate magnetic attraction force. As the flexible display panel is further unrolled/unfolded, the inner housing 2 also moves towards the outer housing 1. In this case, the overlapping width of the first air outlet 13 and the second air outlet 22 in the first direction X gradually reduces, and the width of the air outlet of the heat dissipation assembly 100 matches the unrolled width of the flexible display panel 200. In this way, the heat dissipation assembly 100 can meet heat dissipation requirements of flexible display panels with different unrolled widths.

In the display apparatus of the present disclosure, the width of the air outlet of the heat dissipation assembly 100 matches the unrolled width of the flexible display panel 200. In this way, the heat dissipation assembly 100 can meet the heat dissipation requirements of the flexible display panels with different unrolled widths. In addition, the present disclosure achieves matching between the width of the air outlet of the heat dissipation assembly 100 and the unrolled width of the flexible display panel 200 through cooperation between the first magnet 021 and the second magnet 022, so the heat dissipation assembly 100 has a simple structure.

In addition, it should be noted that the display panel 200 of the display apparatus in the present disclosure may be a non-flexible display panel or the flexible display panel. When the display panel is the non-flexible display panel, the overlapping width of the first air outlet 13 and the second air outlet 22 can be adjusted based on the size of the display panel 200 in the first direction to enable the width of the air outlet of the heat dissipation assembly 100 to match a to-be-cooled region of the non-flexible display panel, to meet a normal operating temperature range of the display apparatus.

Still referring to FIG. 17 and FIG. 18, in some embodiments of the present disclosure, a housing wall of the heat dissipation assembly 100 is provided with an adsorption-type fixing member 14. The display panel 200 is fixedly connected to the heat dissipation assembly 100 through the adsorption-type fixing member 14.

Still referring to FIG. 17 and FIG. 18, the display panel 200 is fixedly connected to the heat dissipation assembly 100 through the adsorption-type fixing member 14, which can bring following advantages.

Firstly, when there is a need to dissipate heat for the display panel 200, the display panel 200 may be detachably connected to the first air outlet 13 and/or the second air outlet 22 of the heat dissipation assembly 100, and the heat dissipation assembly 100 dissipates heat for the display panel 200. When there is no need to dissipate heat for the display panel 200, the display panel 200 may be detached from the heat dissipation assembly 100. The heat dissipation assembly 100 can be used to dissipate heat for another to-be-cooled display panel 200.

Secondly, when the display apparatus is assembled, it is only needed to install the display panel 200 at the air outlet of the heat dissipation assembly by means of a magnetic suction component, which can be handed manually, achieving rapid assembling.

Thirdly, the display panel 200 does not require heat dissipation during all the operation process. When accumulated heat of the display panel 200 reaches a certain level, the heat dissipation assembly 100 can be used to dissipate the heat. When a temperature of the display panel reduces to an acceptable temperature, there is no need to dissipate the heat. In this case, the heat dissipation assembly 100 can be used to dissipate heat for another to-be-cooled display panel 200. In this way, one heat dissipation assembly 100 can meet heat dissipation requirements of a plurality of display panels.

In an exhibition, it is necessary to display a product using the display apparatus for a long time. For a display apparatus with a large-size display panel and long working hours, overheating may occur, so timely heat dissipation is required. The display apparatus with the heat dissipation assembly in the present disclosure is more suitable for this situation, which can be easily carried, easily assembled, and quickly used.

As shown in FIG. 1, FIG. 3, FIG. 17, and FIG. 18, in some embodiments of the present disclosure, the display panel includes the fixed end 01. The fixed end 01 does not have a display function and is mainly used for fixing and installation, and therefore does not require heat dissipation. Therefore, in order to effectively utilize the air flow, the first air outlet 13 of the outer housing 1 is disposed away from the fixed end 01. Therefore, along the first direction X, a distance H1 is reserved between the first air outlet 13 and the end of the outer housing 1 where the first air inlet 11 is provided. Still referring to FIG. 3, because the fixed end 01 does not require heat dissipation, one end of the inner housing 2 is also separated from the first air inlet 11 by a distance h1 in the first direction X, and the distance h1 is approximately equal to the distance H1. In addition, as shown in FIG. 9, a position between one end of the inner housing 2 and the first air inlet 11 can be used to dispose the drive device.

Still referring to FIG. 17 and FIG. 18, along the second direction Y, the first air outlet 13 is located at a top of the outer housing 1. The first air outlet 13 is opposite to a bottom housing wall of the outer housing 1, and an outer surface of the bottom housing wall is flat. The bottom housing wall of the outer housing 1 is flat. Therefore, the heat dissipation assembly 100 can be placed horizontally on the ground without a need for additional auxiliary bracket or apparatus, achieving good stability.

In conclusion, the display panel and the display apparatus provided in the present disclosure at least have following beneficial effects.

The heat dissipation assembly 100 in the present disclosure can adjust the overlapping width of the first air outlet 13 and the second air outlet 22 along the first direction X based on the required heat dissipation width of the to-be-cooled object, such that the width of the air outlet of the heat dissipation assembly 100 is suitable for the required heat dissipation width of the to-be-cooled object. This can make the air volume of the air outlet of the heat dissipation assembly 100 be more effectively utilized, to prevent the cold air from being wasted if the width of the air outlet of the heat dissipation assembly 100 is greater than the required heat dissipation width of the to-be-cooled object, thereby improving a cold air utilization rate of a heat dissipation apparatus. In addition, the heat dissipation assembly 100 in the present disclosure includes the inner housing 1 and the outer housing 2, and the inner housing 1 may be located in the outer housing 2. In this way, when the heat dissipation assembly 100 does not work or when the required heat dissipation width of the to-be-cooled object is small, the heat dissipation assembly 100 occupies small space and can be easily carried or placed. Finally, the heat dissipation assembly 100 in the present disclosure has the independent structure and can be independent of the to-be-cooled object. Therefore, the heat dissipation assembly 100 is relatively independent, and can be easily assembled or maintained.

The display apparatus in the present disclosure includes the heat dissipation assembly 100, and the display panel 200 is located at one side of the first air outlet 13. The heat dissipation assembly 100 and the display panel 200 are independent in their respective composition structures. The heat dissipation assembly 100 and the display panel 200 have the good structural independence and the high reliability. In addition, the inner housing 2 of the heat dissipation assembly in the present disclosure may be located in the outer housing 1. Therefore, the display apparatus in the present disclosure has a small volume and good portability. In addition, due to the adjustable width, the adjustable air flow, and the adjustable air flow direction of the air outlet, the heat dissipation assembly 100 in the present disclosure can ensure that the display panel 200 in the present disclosure is within the normal operating temperature range. Therefore, the display apparatus in the present disclosure has good working performance and reliability.

Although some specific embodiments of the present disclosure have been explained in detail through examples, those skilled in the art should understand that the above examples are only for illustration and not intended to limit the scope of the present disclosure. Those skilled in the art should understand that modifications can be made to the aforementioned embodiments without departing from the scope and spirit of the present disclosure. The scope of the present disclosure is defined by the appended claims.

What is claimed is:

1. A heat dissipation assembly, comprising a housing, wherein the housing comprises:
   an outer housing; and
   an inner housing,
   wherein, along a first direction, the outer housing comprises:
      a first air inlet provided at a first end of the outer housing;
      an installation port provided at a second end of the outer housing and used for installing the inner housing, and wherein a housing wall of the outer housing is provided with a first air outlet extending along the first direction,
   wherein the inner housing comprises a second air inlet provided at an end of the inner housing, the second air inlet is disposed opposite to the first air inlet along the first direction, and a housing wall of the inner housing is provided with a second air outlet extending along the first direction,
   wherein the inner housing is sleeved in the outer housing, the first air outlet and the second air outlet at least partially overlap along a second direction to form an air outlet overlapping part, the first air outlet exposes at least a portion of the second air outlet, and the first direction crosses the second direction, and
   wherein the heat dissipation assembly has a first working state and a second working state, and a width of the air outlet overlapping part along the first direction is L1 in the first working state and L2 in the second working state, wherein L1>L2.

2. The heat dissipation assembly according to claim 1, wherein the first air inlet of the outer housing comprises a plate comprising a central region and an edge region surrounding the central region, the central region comprises a central hole, the edge region comprises a plurality of edge holes at least partially surrounding the central hole, and a width of the central hole along a direction perpendicular to the first direction is greater than a width of an edge hole of the plurality of edge holes along the direction perpendicular to the first direction.

3. The heat dissipation assembly according to claim 1, wherein the inner housing further comprises an inner air duct;
   wherein the inner air duct is connected to the second air outlet and comprises a first end and a second end that are disposed opposite to each other along the first direction, and the first end is located at a side of the second end adjacent to the first air inlet, and
   wherein a sectional area of the inner air duct at the first end along the second direction is greater than a sectional area of the inner air duct at the second end along the second direction.

4. The heat dissipation assembly according to claim 3, wherein the inner air duct further comprises a first baffle and a second baffle that are disposed opposite to each other along a third direction, and the third direction crosses both the first direction and the second direction,
   wherein the first baffle comprises a first surface facing the second baffle, the second baffle comprises a second surface facing the first baffle, and an included angle between the first surface and the second surface is $\gamma$, wherein $0°<\gamma<90°$, and
   wherein the second air outlet is at least partially non-overlapping with the first baffle or the second baffle along the second direction.

5. The heat dissipation assembly according to claim 4, wherein, along the first direction, the first end of the inner air duct is provided with a third air inlet communicated with the first air inlet, and
   wherein the third air inlet comprises an air blocking part, the air blocking part comprises a first air blocking part connected to the first baffle and a second air blocking part connected to the second baffle, and at least one of the inner housing or the outer housing abuts against the air blocking part to form the third air inlet.

6. The heat dissipation assembly according to claim 1, further comprising a blow fan, wherein, along the first direction, the blow fan is located at a side of the first air inlet away from the installation port.

7. The heat dissipation assembly according to claim 1, further comprising an exit-air regulating structure located at at least one of the first air outlet or the second air outlet, wherein the exit-air regulating structure comprises a rotating shaft extending along the first direction, and the exit-air regulating structure is pivotable around the rotating shaft.

8. The heat dissipation assembly according to claim 7, wherein the first air outlet comprises a first side wall and a second sidewall opposite to each other along a third direction, and the exit-air regulating structure is at least located at the first air outlet, wherein the third direction crosses both the first direction and the second direction, and
wherein the heat dissipation assembly further comprises a drive device that drives the exit-air regulating structure to pivot towards or away from the first sidewall.

9. The heat dissipation assembly according to claim 8, wherein the exit-air regulating structure further comprises a first exit-air regulating structure corresponding to the first air outlet and a second exit-air regulating structure corresponding to the second air outlet, and
wherein the second air outlet comprises a third sidewall and a fourth sidewall opposite to each other along the third direction, the first exit-air regulating structure is at least partially located between the first sidewall and the second sidewall, the second air outlet is at least partially located between the third sidewall and the fourth sidewall, the second exit-air regulating structure is located between the first exit-air regulating structure and the third sidewall, and at least one of the first exit-air regulating structure or the second exit-air regulating structure is connected to the drive device.

10. The heat dissipation assembly according to claim 9, further comprising a linkage structure, wherein the linkage structure comprises a groove and a protrusion that are engaged with each other, the groove is disposed in one of the first exit-air regulating structure and the second exit-air regulating structure, and the protrusion is disposed in the other one of the first exit-air regulating structure and the second exit-air regulating structure.

11. The heat dissipation assembly according to claim 9, further comprising a linkage structure comprising a guide rail and a groove, wherein the groove comprises a first groove located in the first exit-air regulating structure and a second groove located in the second exit-air regulating structure, the guide rail is located between the first exit-air regulating structure and the second exit-air regulating structure, and the first groove and the second groove are separately engaged with the guide rail.

12. The heat dissipation assembly according to claim 9, wherein, along the third direction, at least one of the first exit-air regulating structure or the second exit-air regulating structure is provided with a convex block on a surface facing the first sidewall.

13. The heat dissipation assembly according to claim 7, further comprising a sealing member configured to seal at least one of a gap between the exit-air regulating structure and a sidewall of the first air outlet or a gap between the exit-air regulating structure and a sidewall of the second air outlet.

14. The heat dissipation assembly according to claim 1, wherein the heat dissipation assembly further comprises a third working state, and, in the third working state, an air regulating angle θ between a plane of the first exit-air regulating structure and a plane of the second exit-air regulating structure satisfies 0°<θ<90°.

15. The heat dissipation assembly according to claim 1, further comprising a sliding structure provided between the inner housing and the outer housing, wherein the sliding structure extends along the first direction, and wherein the sliding structure comprises a sliding rail and a chute that are slidably matched with each other, the sliding rail is disposed on one of an outer wall of the inner housing and an inner wall of the outer housing, and the chute is disposed on the other one of the outer wall of the inner housing and the inner wall of the outer housing.

16. A display apparatus, comprising:
a display panel; and
a heat dissipation assembly, wherein the heat dissipation assembly comprises a housing, and the housing comprises:
an outer housing; and
an inner housing,
wherein, along a first direction, the outer housing comprises a first air inlet provided at a first end of the outer housing and an installation port provided at a second end of the outer housing and used for installing the inner housing, and a housing wall of the outer housing is provided with a first air outlet extending along the first direction,
wherein the inner housing comprises a second air inlet provided at an end of the inner housing, the second air inlet is disposed opposite to the first air inlet along the first direction, and a housing wall of the inner housing is provided with a second air outlet extending along the first direction,
wherein the inner housing is sleeved in the outer housing, the first air outlet and the second air outlet at least partially overlap along a second direction to form an air outlet overlapping part, the first air outlet exposes at least a portion of the second air outlet, and the first direction crosses the second direction,
wherein the heat dissipation assembly has a first working state and a second working state, and a width of the air outlet overlapping part along the first direction is L1 in the first working state and L2 in the second working state, wherein L1>L2, and
wherein, along the second direction, the display panel is located at a side of the first air outlet, and the heat dissipation assembly is configured to dissipate heat of the display panel.

17. The display apparatus according to claim 16, wherein the display apparatus comprises a first working mode, and in the first working mode, at least one side edge of the display panel extends along the first direction.

18. The display apparatus according to claim 16, wherein the display panel is a flexible display panel, and the display panel has rolled and unrolled states;
wherein, along the first direction, the flexible display panel comprises a fixed end and a movable end, the fixed end is fixedly connected to the outer housing, and the movable end is moveable with respect to the fixed end along the first direction to unroll the flexible display panel,
wherein the movable end comprises a first magnet, and
wherein, along the first direction, an end of the inner housing opposite to the first air inlet comprises a second magnet, and the second magnet is located on a movement path of the first magnet.

19. The display apparatus according to claim 16, wherein a housing wall of the heat dissipation assembly comprises an adsorption-type fixing member, and the display panel is fixedly connected to the heat dissipation assembly through the adsorption-type fixing member.

* * * * *